(12) United States Patent
Tsujimura et al.

(10) Patent No.: US 6,632,115 B1
(45) Date of Patent: Oct. 14, 2003

(54) METHOD FOR FORMING TRANSPARENT CONDUCTIVE FILM USING CHEMICALLY AMPLIFIED RESIST

(75) Inventors: Takatoshi Tsujimura, Fujisawa (JP); Takashi Miyamoto, Choufu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/857,654

(22) PCT Filed: Dec. 1, 1999

(86) PCT No.: PCT/JP99/06750
§ 371 (c)(1),
(2), (4) Date: Aug. 17, 2001

(87) PCT Pub. No.: WO00/34961
PCT Pub. Date: Jun. 15, 2000

(30) Foreign Application Priority Data

Dec. 10, 1998 (JP) .......................... 10-350823

(51) Int. Cl.$^7$ .................................. H01J 9/02
(52) U.S. Cl. ........................ 445/24; 430/313
(58) Field of Search ............................ 445/24; 430/313

(56) References Cited

U.S. PATENT DOCUMENTS

| | | | |
|---|---|---|---|
| 5,085,972 A | * | 2/1992 | Vogel ...................... 430/270.1 |
| 5,633,111 A | * | 5/1997 | Yoshimoto et al. ......... 430/165 |
| 5,750,316 A | * | 5/1998 | Kawamura et al. ......... 430/311 |
| 6,054,254 A | * | 4/2000 | Sato et al. .................. 430/322 |

FOREIGN PATENT DOCUMENTS

| | | | |
|---|---|---|---|
| JP | 06-132208 | * | 5/1994 |
| JP | 07-028073 | * | 1/1995 |
| JP | 8-217578 | * | 8/1996 |
| JP | 10-069229 | * | 3/1998 |
| JP | 10-207065 | * | 8/1998 |
| JP | 10-280127 | * | 10/1998 |

* cited by examiner

Primary Examiner—Kenneth J. Ramsey
(74) Attorney, Agent, or Firm—Scully, Scott, Murphy & Presser; Robert M. Trepp, Esq.

(57) ABSTRACT

A method for patterning an indium-tin-oxide (ITO) film by using a chemically amplified resist, causing no resist separation nor adhesion degradation even if the ITO film is exposed to white light after the resist development. An amorphous ITO film is formed on a wafer. A negative chemically amplified resist is applied directly to the ITO film, and the resist film is exposed and developed. The structure having a resist pattern on the amorphous ITO film is free from resist separation and adhesion degradation even if the resist pattern is exposed to white light, and therefore the later manufacturing steps are not adversely affected, enabling proper visual inspection. After the structure is judged to be acceptable at the visual inspection, the amorphous ITO film is etched using the resist pattern as a mask, and then the resist pattern is removed. The ITO film is heated over the crystallization temperature of the ITO to form a crystallized ITO pattern having a chemical-resistance and a good electrical conductivity.

19 Claims, 2 Drawing Sheets

FIG. 1 a) DEPOSITING CRYSTALLIZED ITO FILM BY SPUTTERING

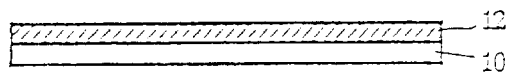

b) PROVIDING RESIST AND EXPOSING

UV LIGHT

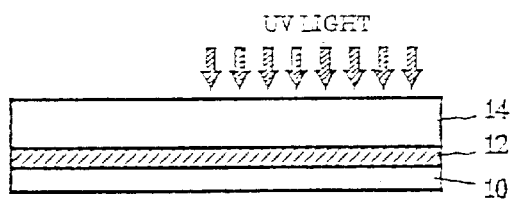

c) DEVELOPING RESIST

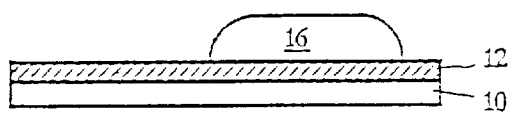

VISUAL INSPECTION UNDER YELLOW LIGHT → d) ETCHING CRYSTALLIZED ITO FILM

VISUAL INSPECTION UNDER WHITE LIGHT → d') PEELING AND LINE-WIDTH DISTRIBUTION DETERIORATION OCCUR BECAUSE OF REDUCED ADHESION BETWEEN RESIST-ITO

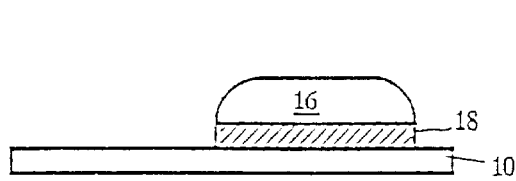
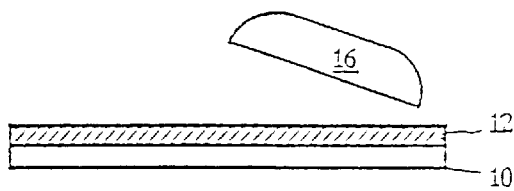

e) REMOVING RESIST e') ITO PATTERN DISAPPEARS OR BECOMES THIN

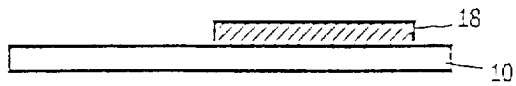
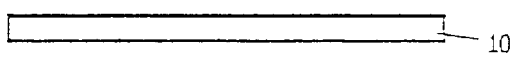

FIG. 2
a) DEPOSITING AMORPHOUS ITO FILM BY SPUTTERING
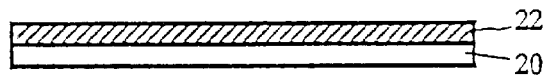
b) PROVIDING RESIST AND EXPOSING
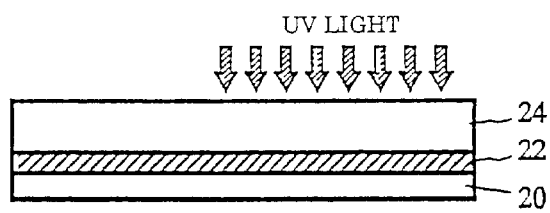
c) DEVELOPING RESIST
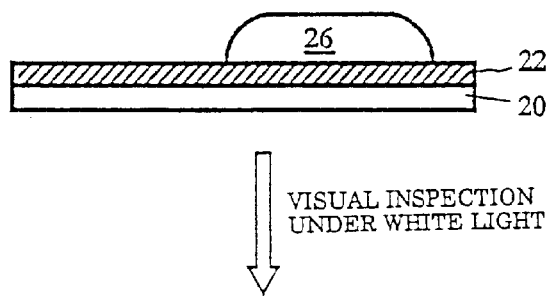
⇓ VISUAL INSPECTION UNDER WHITE LIGHT
d) ETCHING AMORPHOUS ITO FILM
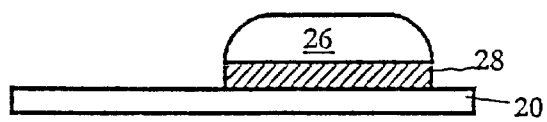
e) REMOVING RESIST
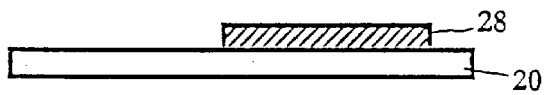
f) ANNEALING AMORPHOUS ITO FILM TO BE CRYSTALLIZED
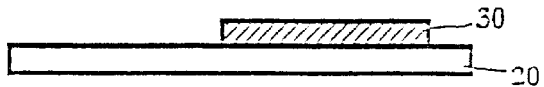

METHOD FOR FORMING TRANSPARENT CONDUCTIVE FILM USING CHEMICALLY AMPLIFIED RESIST

TECHNICAL FIELD

The present invention relates to a process for patterning an oxide transparent electrically conductive film and, more specifically, a process for micro-patterning an Indium-Tin-Oxide (ITO) film. Also, the present invention relates to a process for patterning a transparent electrode to form a high density flat panel display.

BACKGROUND ART

Efforts have been made to further advance a technology for providing a high density and high image quality flat panel display. A current high image quality flat panel display is realized in the form of an active matrix type liquid crystal display. The active matrix type display includes a transparent electrically conductive film arranged mosaically in one substrate to be used as a pixel electrode and a switching element formed for each pixel, and controls each pixel electrode independently. Such a structure is made by applying a technology, of an integrated circuit or microelectronics.

As a transparent electrically conductive film for forming a pixel electrode, an ITO film is most generally used. With a higher pixel density, a size of one pixel is micronized more, and a pixel size of approximately 40 $\mu$m in square is required. In the meantime, a screen has been enlarged, which resulted in the increase in the number of pixels. In the case of a QSXGA display, approximately 15 million pixels must be formed. Moreover, even if one pixel is defective, its substrate becomes a defective product. Thus, a more precise and accurate patterning technology of an ITO film is required.

A chemically amplified resist was developed for a micro-fabrication technology used to form a submicron order feature of VLSI. The chemically amplified resist overcomes an optical resolution limit of a conventional resist, and shows high resolution and high sensitivity to a deep ultra-violet light. Generally, the chemically amplified resist contains a photo-acid generating material such as onium salt, which is photolyzed to generate an acid and the acid reacts on an acid labile group, thereby changing solubility of the resist. At this time, the acid generated by the photolysis serves as a catalyst and takes part in reaction by a number of times, and thus high photosensitivity of the resist is provided.

This chemically amplified resist is also useful for a micro-patterning of an ITO film, which is carried out to form a transparent electrode as a pixel electrode of a high density flat panel display. Particularly, a negative chemically amplified resist is very effective for forming fine patterns and reducing a point defect such as a short in patterning of the ITO film, and therefore it is often used. A process for forming the transparent electrode is shown in FIG. 1. First, a polycrystalline ITO film 12 is formed on a substrate 10 by a conventional method such as a sputtering method (FIG. 1(a)). A transparent electrode is typically formed to have a thickness of approximately 400 to 1500 Å. A negative chemically amplified resist 14 is provided directly on the polycrystalline ITO film 12 to have a thickness of approximately 1.5 to 2.0 $\mu$m, and a part to be a pixel is irradiated (FIG. 1(b)). Then, the resist 14 is baked optionally and developed to obtain a resist pattern 16 (FIG. 1(c)). By using this pattern 16 as a mask, the ITO film 12 is etched in a etchant, for example, mixed aqueous solution of nitric acid and hydrochloric acid, and then the ITO film 12 can be patterned.

For the substrate after the resist development, some kinds of visual inspections, e.g. inspection of pattern defects, inspection of defects, inspection of contaminants or dust and so on, are performed. These inspections are essential to improvements of process yield and stability. However, it was found that if the substrate is placed under a white light or a green light for the inspection, adhesion of the resist pattern to the ITO film is reduced (FIG. 1(d')), and in the ITO etching step which is subsequently performed, resist peeling or deterioration of line width distribution occurs (FIG. 1(e')). This problem may be attributed to the fact that photolysis reaction occurs in the photo-acid generating material contained in the resist, additional acid is generated in the resist pattern 16, and this acid corrodes the ITO film in the boundary between the ITO film 12 and the resist 16. In order to prevent the generation of additional acid, all the inspections mentioned above must be carried out under a yellow light which does not include an absorption spectrum of the photo-acid generating material, i.e. a light which wavelength of approximately 380 nm or lower should not be included (FIG. 1(d)). Under the yellow light, no resist peeling or no deterioration of the line width distribution occurs (FIG. 1(e)). In practice, however, it is very difficult to perform satisfactory inspection under the yellow light. Further, not only the inspection but also any steps including carrying before etching of the ITO film must be carried out under the yellow light while avoiding a white light. In order to do so, yellow lamps must be installed not only in an etching room but also all hinds of passages, AGV, stockers, and so on.

In order to solve the problem in which acid generated by exposing the chemically amplified resist diffuses into the electrically conductive substrate during the patterning by using the chemically amplified resist, Japanese Patent Laid-Open No. H6(1994)-132208 teaches us to provide an insulating thin film beforehand on the electrically conductive substrate, and provide the chemically amplified resist thereon. However, the provision of another layer between the layer to be patterned and the resist leads to increase in the number of steps and costs, as well as to reduce in yield.

DISCLOSURE OF INVENTION

An object of the present invention is to provide a process which solves a problem involved in resist peeling or reduced adhesion caused by light exposure after pattern formation, thereby achieving micro-patterning for an ITO film with a precision and accuracy.

Another object of the present invention is to provide a process for manufacturing a high image quality flat panel display with high yield by integrating, at a high density, a transparent electrode made of an ITO film. For this purpose, visual inspection of the patterned transparent electrode under a white light or a green light should be necessary.

According to the present invention, a novel process for patterning an ITO film is provided. The process comprises the steps of: preparing an amorphous ITO film on a substrate; applying a negative chemically amplified photosensitive material (or resist) directly on the amorphous ITO film, and exposing and developing the negative chemically amplified photosensitive material to form a pattern; and removing a part of the amorphous ITO film which is not covered with the pattern. According to the process of the present invention, even if the pattern of the chemically amplified photosensitive material is exposed to a white light or a green light for visual inspection, no resist peeling or no reduction in adhesion occurs.

Another advantage of the present invention is that in the step of removing the part of the amorphous ITO film, relatively mild acid such as oxalic acid or phosphoric acid can be used as etching solution instead of using such strong acid as hydrochloric acid or nitric acid. In this way, the possibility of damage by strong acid during etching, for example, corrosion of an underlayer made of metal such as aluminum, can be eliminated. Accordingly, a patterned ITO film can be easily formed even on a metal feature.

The patterned amorphous ITO film obtained by the process of the present invention is heated so as to be converted into a microcrystalline material, thereby obtaining a crystallized ITO film which exhibits chemical resistance and good electrical conductivity.

According to an aspect of the present invention, a novel process for manufacturing a TFT substrate used for a flat panel display is provided. A pixel electrode of this TFT substrate is formed by using the process for patterning a transparent electrically conductive film, which is provided by the present invention. Specifically, the process comprises the steps of preparing an amorphous ITO film on a substrate; providing a negative chemically amplified photosensitive material directly on the amorphous ITO film, and exposing and developing the negative chemically amplified photosensitive material to form a pattern; removing a part of the amorphous ITO film which is not covered with the pattern; removing the pattern; and heating the amorphous ITO film to be microcrystallized. With the process of the present invention, since visual inspection under a white light or a green light can be surely performed after the chemically amplified photosensitive material (resist) is developed to form a resist pattern, a TFT substrate used for a high image quality flat panel display can be manufactured with high yield.

BRIEF DESCRIPTION OF DRAWINGS

FIG. 1 shows a schematic view showing a conventional process for patterning a transparent electrically conductive film.

FIG. 2 shows a schematic view showing a process for patterning a transparent electrically conductive film according to the present invention.

BEST MODE FOR CARRYING OUT THE INVENTION

The present invention provides a novel process for micropatterning an Indium-Tin-Oxide (ITO) film by using a chemically amplified resist. According to the process of the present invention, first an amorphous ITO film is formed, and patterned by using a chemically amplified resist. Then, as occasion arises, the patterned amorphous ITO film is converted into a microcrystalline material by heating to form a usual crystallized ITO film pattern which exhibits a good electrical conductivity and chemical resistance.

FIG. 2 shows a process of forming a transparent electrode, i.e., a patterned transparent electrically conductive film. In FIG. 2(a), an amorphous ITO film 22 is deposited onto a substrate 20. The amorphous ITO film 22 is formed by a sputtering method at a substrate temperature which is usually held at approximately 200° C. or lower, preferably at a relatively low temperature of nearly a room temperature. For example, as described in Japanese Patent No. 2136092, sputtering may be performed by using an In-Sn alloy target and with Ar gas containing $O_2$ gas and $H_2O$ gas used as sputtering gas.

In FIG. 2(b), a chemically amplified photosensitive material (resist) 24 is directly applied on the amorphous ITO film 22. Preferably, a negative type chemically amplified photosensitive material 24 should be applied. As is recited in Technical Paper (Regional Technical Conf., Oct. 30 to Nov. 2, 1988, p.49) written by W. E. Feely and et al, as for such resin, an improved negative chemically amplified resist which contains a phenolic novolak resin, methylol melamine and photo-acid generator. For this resist, acid generated by a light is used as a catalyst, and the methylol melamine causes the phenol resin to be cross-linked so as to be converted to be insoluble. As a photo-acid generator, onium salt such as diazonium, iodonium, sulfonium or the like, ortho-diazo naphthoquinone sulfonium acid ester, or triazines generators may be used. Particularly, the triazines generator is suitably used because of high sensitivity. Acid generated upon exposure to a light is considered to be protic acid.

In FIG. 2(c), the film of the chemically amplified photosensitive material 24 is exposed to energy rays such as ultraviolet rays, deep ultraviolet rays, electron rays or X rays in accordance with the pattern. In the pattern of several microns, use of the ultraviolet ray is convenient. As usually carried out, by post exposure baling (PEB) and developing the resist after the exposure, the resist is patterned. A fine line/space pattern of approximately 2 $\mu$m is formed.

By the steps hitherto performed, a structure having a resist pattern 26, preferably a negative resist pattern 26, provided on the amorphous ITO film 22 is formed. This structure obtained in accordance with the present invention is different from a conventional structure having a resist pattern provided on a polycrystalline ITO film in that even if exposed under white light or green light containing a spectrum with a wavelength of approximately 380nm or lower, no resist peeling or no reduction in adhesion occurs. The reason for this is still under investigation, but it may be attributed to the fact that even if additional acid is generated in the resist pattern 26 by white light or the like, the acid can be diffused and dispersed into the amorphous ITO film 22, and thus no high concentration of acid for corroding the amorphous ITO film 22 exists in the boundary between the amorphous ITO film 22 and the resist film 26. Accordingly, the structure obtained in accordance with the present invention enables visual inspection to be performed under white light or green light without adversely affecting subsequent steps.

In FIG. 2(d), the substrate which has been subjected to sufficient visual inspection after the resist development, determined to be a good product and provided with the resist pattern 26 is patterned by etching the amorphous ITO film 22 through the pattern 26 used as a mask. A part of the amorphous ITO film 22 which is not covered with the resist pattern 26 is contacted with etching solution to be dissolved and removed. As etching solution, organic acid such as oxalic acid, as well as relatively mild mineral acid such as phosphoric acid or sulfuric acid, may be used. After the patterning of the amorphous ITO film 22, the resist pattern 26 is removed by an appropriate method as usual (FIG. 2(e)).

As chemical resistance, especially acid resistance, of the amorphous ITO film 22 is low compared with a usual microcrystalline ITO film, the amorphous ITO film 22 can be dissolved even in such a relatively mild acid as described above. On the other hand, however, if the amorphous ITO film 22 is incorporated in a product such as a flat panel display or the like, damage may occur in subsequent steps or during use. Moreover, since the amorphous ITO film usually shows high resistivity of approximately $5 \times 10^{-3}$ Ω·cm, a film having lower resistivity must be provided to be used as a transparent electrode. Thus, in FIG. 2(f) a patterned amorphous ITO film 28 is heated up to reach a temperature of approximately 200° C. or higher, which is a crystallization temperature of ITO. Preferably, the film is heated at a temperature of approximately 250° C. for about one to two hours. By this heat treatment, the amorphous ITO film 28 is converted into a microcrystalline material, thereby obtaining a crystallized ITO film 30 which exhibits chemical resistance and low resistivity.

This process for forming the transparent electrode, i.e., the patterning method of the transparent electrically conductive film including the ITO film, is very useful for forming a pixel electrode of a TFT substrate for a flat panel display, and it can also be applied to a process for manufacturing a solar battery, electronic parts, a measuring instrument, a communication device or the like, which needs a transparent electrically conductive film. If the process is applied to a process for forming a structure where a transparent electrically conductive film is used as a heating unit, a microheater capable of adjusting a temperature of only a very limited area can be provided. As a transparent electrically conductive film, other than the ITO film, a transparent electrically conductive film which contains an oxide such as an indium oxide film, a tin oxide film (nesa film), a cadomium-tin-oxide (CTO) or the like is available.

Embodiment 1

An ITO film (400 Å) was deposited on a glass substrate held at approximately 25° C. by a sputtering method. This ITO film was an amorphous ITO film, because it was not heated to a crystallization temperature or higher. On the other hand, for the purpose of comparison, an ITO film (400 Å) was prepared on a glass substrate of approximately 150° C. by sputtering, and heated at approximately 230° for about two hours to form a completely crystallized ITO film.

On both of the amorphous ITO film and the crystallized ITO film, similar negative chemically amplified resists were provided so as to be approximately 1.5 μm in thickness. The used negative chemically amplified resists were Fuji Orin FEN 300 N, Clariant (prototype) and Tokyo Oka TFN-010. Then, the coated resists were exposed to ultraviolet radiation of a wavelength of 405nm, subjected to PEB at approximately 110° C., and then developed by using usual alkaline aqueous developing solution to obtain various resist patterns having line/space widths of approximately 2 to 100 nm. In any combination samples of the substrates and the resists, no resist peeling or no line defects were identified. Also, in any of the samples not exposed to light after development, no resist peeling was identified after water rinsing (shower).

The samples were exposed to the light of a fluorescent lamp for about thirty minutes. Then, the samples were similarly rinsed by water, and for the resist patterns on the amorphous ITO film, no peeling was identified at all in the samples using any of the resists. However, undesired peeling of the resist pattern occurred on the crystallized ITO film. The results are shown in Table 1. Even in the case of Tokyo Oka resist where the occurrence of defect of peeling was smallest, it was identified in 34 points of peeling among 67 patterns.

The patterned amorphous ITO film was heated at approximately 230° for about two hours, thereby converting the amorphous ITO film into a microcrystallized ITO, and then the electrically conductive film of the crystallized ITO exhibiting resistivity of approximately $1 \times 10^{-4}$ Ω·cm was obtained.

TABLE 1

| Resist/Substrate | Amorphous ITO | Crystallized ITO |
| --- | --- | --- |
| Fuji Orin FEN 300 N | No peeling | 40/64 place peeling |
| Clariant Prototype | No peeling | 60/64 place peeling |
| Tokyo Oka TFN-010 | No peeling | 34/67 place peeling |

Embodiment 2

As in the case of Embodiment 1, a sample which has each resist applied onto an amorphous ITO film, subjected to exposure and PEB, and then developed to form a resist pattern. The resultant sample was exposed to green light used for actual visual inspection for about thirty minutes. Then, the sample was rinsed by water (shower) as same as in the case of Embodiment 1. No resist peeling was identified.

Embodiment 3

As in the case of Embodiment 1, a sample which has each resist applied onto an amorphous ITO film, subjected to exposure and PEB, and then developed to form a resist pattern. The resultant sample was left in a usual indoor environment for half a day. Then, the sample was rinsed by water (shower) as same as in the case of Embodiment 1. No resist peeling was identified.

What is claimed is:

1. A process for forming an ITO film, comprising the steps of:
    preparing an amorphous ITO film onto a substrate;
    providing a negative chemically amplified photosensitive material directly onto said amorphous ITO film, and exposing and developing said negative chemically amplified photosensitive material to form a pattern of said negative chemically amplified photoresist; and
    treating said amorphous ITO film through said pattern used as a mask.

2. The process according to claim 1, wherein the step of treating said amorphous ITO film comprises a step of removing a part of said amorphous ITO film which is not covered with said pattern.

3. The process according to claim 2, wherein the step of removing said amorphous ITO film comprises a step of bringing the part of the amorphous film ITO which is not covered with the pattern into contact with acid selected from the group consisting of oxalic acid, phosphoric acid and sulfuric acid.

4. The process according to claim 1, said process further comprising a step of removing said pattern.

5. The process according to claim 1, said process further comprising a step of heating said amorphous ITO film to microcystallize said amorphous ITO film.

6. The process according to claim 1, wherein said negative chemically amplified photosensitive material comprises phenolic novolak, methylol melamine and a photo-acid generator.

7. Process according to claim 6, wherein said photo-acid generator is triazines.

8. A process for forming a transparent oxide conductive film of, comprising the steps of:
    preparing an amorphous film of said oxide onto a substrate;

providing a negative chemically amplified photosensitive material directly onto said amorphous film, and exposing and developing the negative chemically amplified photosensitive material to form a pattern; and treating said amorphous film by said pattern used as a mask.

9. The process according to claim 8, said process further comprising a step of heating said amorphous film to microcrystalliie said amorphous film.

10. The process according to claim 8, wherein the oxide comprises ITO.

11. A structure including transparent conductive oxide film which is formed by the process of claim 8.

12. A process for inspecting a resist pattern on a substrate, characterized in that said substrate has an amorphous ITO film; said resist pattern includes a negative chemically amplified photosensitive material, said resist pattern being provided directly on said amorphous ITO film; the negative chemically amplified photosensitive material contains a photo-acid generator; and the inspection is performed under a light including an absorption spectrum of the photo-acid generator.

13. The process according to claim 12, wherein said light includes a spectrum having a wavelength of approximately 380 nm or less.

14. A process for manufacturing a flat panel display with an ITO film, comprising the steps of:

depositing an amorphous ITO film onto a substrate;

providing a negative chemically amplified photosensitive material directly onto said amorphous ITO film, and exposing and developing said negative chemically amplified photosensitive material to form a pattern;

removing a part of said amorphous ITO film which is not covered with said pattern;

removing said pattern; and heating said amorphous ITO film to microcrystallize said amorphous ITO film.

15. The process according to claim 14, said process further comprising a step of inspecting said substrate after the development under a light which includes a spectrum having a wavelength of approximately 380 nm or less.

16. The process according to claim 14, characterized in that said substrate has a metal feature provided thereon.

17. The process according to claim 14, wherein the step of removing the amorphous ITO film includes a step of brining the part of the amorphous ITO film which is not covered with the pattern into contact with acid selected from the group consisting from oxalic acid, phosphoric acid and sulfuric acid.

18. The process according to claim 14, wherein the negative chemically amplified photosensitive material comprises phenolic novolak, methylol melamine and a photo-acid generator.

19. The process according to claim 18, wherein the photo-acid generator is triazines.

* * * * *